US008581345B2

(12) United States Patent
Russo et al.

(10) Patent No.: US 8,581,345 B2
(45) Date of Patent: Nov. 12, 2013

(54) CHARGE-BALANCE POWER DEVICE COMPRISING COLUMNAR STRUCTURES AND HAVING REDUCED RESISTANCE, AND METHOD AND SYSTEM OF SAME

(75) Inventors: Fabio Russo, Tremestieri Etneo (IT); Antonio Grimaldi, S. Giovanni La Punta (IT); Fabio Zara, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 10 days.

(21) Appl. No.: 13/083,012

(22) Filed: Apr. 8, 2011

(65) Prior Publication Data

US 2011/0180843 A1    Jul. 28, 2011

Related U.S. Application Data

(63) Continuation-in-part of application No. 12/134,050, filed on Jun. 5, 2008.

(30) Foreign Application Priority Data

Jun. 5, 2007    (IT) .............................. TO2007A0392

(51) Int. Cl.
*H01L 23/62* (2006.01)
(52) U.S. Cl.
USPC .................... 257/355; 257/356; 257/E29.262
(58) Field of Classification Search
USPC ................. 257/263–264, 329, 339, 335, 341, 257/E29.262, E29.257, 342, 355–357, 257/491–492
See application file for complete search history.

(56) References Cited

U.S. PATENT DOCUMENTS

| 6,586,798 | B1 | 7/2003 | Frisina |
| 6,630,698 | B1 | 10/2003 | Deboy et al. |
| 6,683,347 | B1 | 1/2004 | Fujihira |
| 6,693,338 | B2 | 2/2004 | Saitoh et al. |
| 6,903,418 | B2 * | 6/2005 | Iwamoto et al. ............... 257/342 |
| 7,462,909 | B2 * | 12/2008 | Saito et al. ..................... 257/329 |
| 7,576,393 | B2 | 8/2009 | Ono et al. |
| 7,759,733 | B2 * | 7/2010 | Ono et al. ...................... 257/341 |
| 7,973,362 | B2 * | 7/2011 | Willmeroth et al. .......... 257/341 |
| 8,008,699 | B2 * | 8/2011 | Hashimoto et al. ........... 257/296 |
| 8,148,815 | B2 * | 4/2012 | Girdhar et al. ................ 257/724 |
| 8,154,088 | B1 * | 4/2012 | Khoueir et al. ............... 257/401 |
| 2002/0014671 | A1 | 2/2002 | Saggio et al. |
| 2004/0094819 | A1 * | 5/2004 | Saitoh et al. .................. 257/492 |
| 2006/0175662 | A1 * | 8/2006 | Tihanyi et al. ................ 257/355 |
| 2006/0216896 | A1 * | 9/2006 | Saito et al. .................... 438/270 |
| 2008/0303082 | A1 | 12/2008 | Zara |

* cited by examiner

*Primary Examiner* — Matthew W Such
*Assistant Examiner* — Ali Naraghi
(74) *Attorney, Agent, or Firm* — Graybeal Jackson LLP

(57) ABSTRACT

An embodiment of a charge-balance power device formed in an epitaxial layer having a first conductivity type and housing at least two columns of a second conductivity type, which extend through the epitaxial layer. A first and a second surface region of the second conductivity type extend along the surface of the epitaxial layer on top of, and in contact with, a respective one of the columns, and a second and a third surface region of the first conductivity type extends within the first and the second surface region, respectively, facing the surface of the epitaxial layer. The columns extend at a distance from each other and are arranged staggered to one another with respect to a first direction and partially facing one another with respect to a second direction transversal to the first direction.

63 Claims, 8 Drawing Sheets

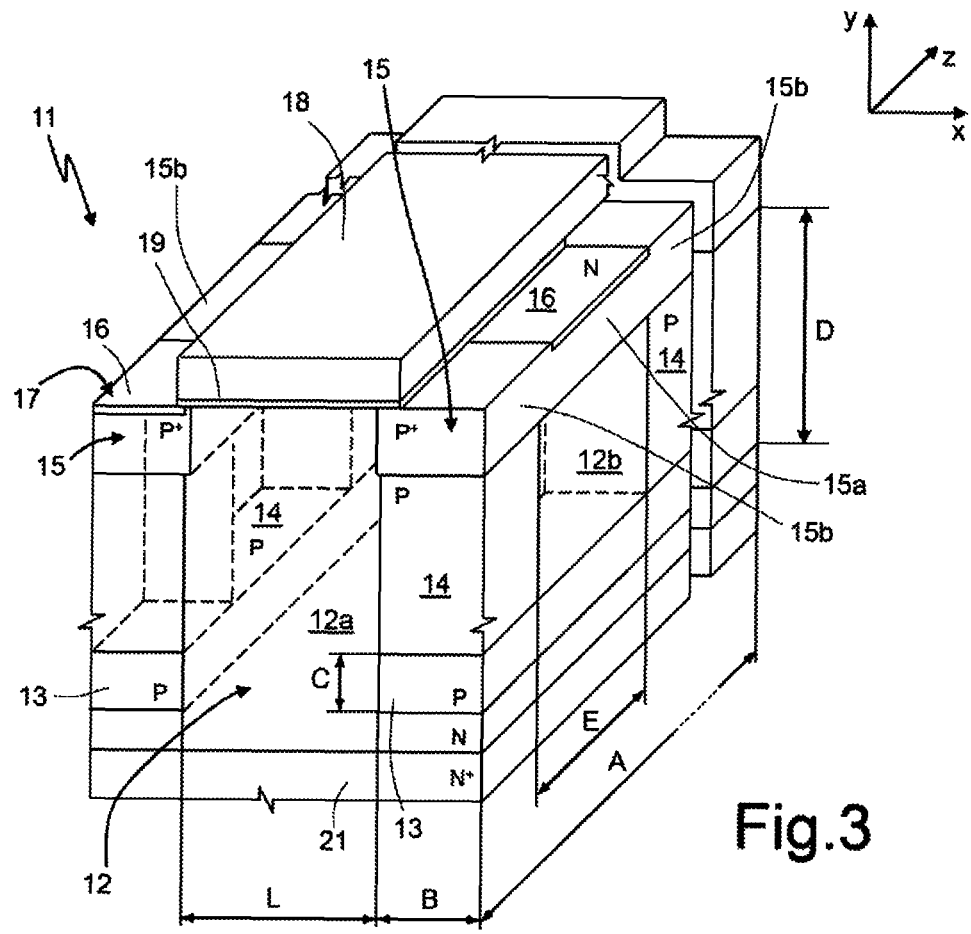
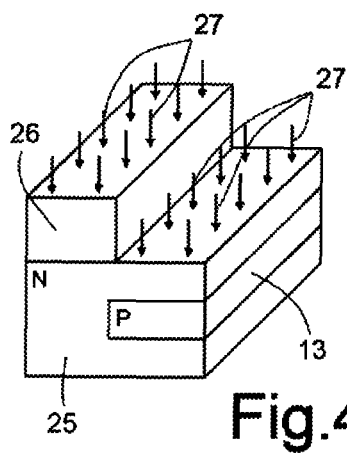
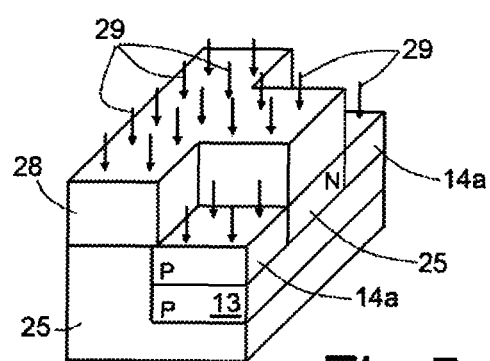

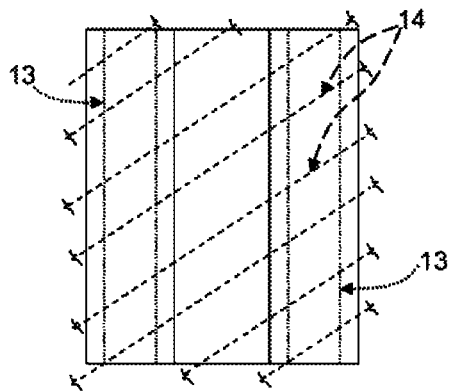 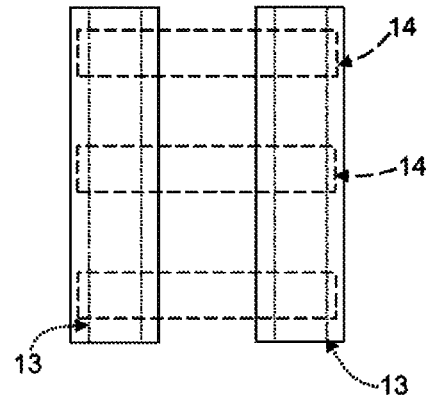
Fig.20  Fig.21
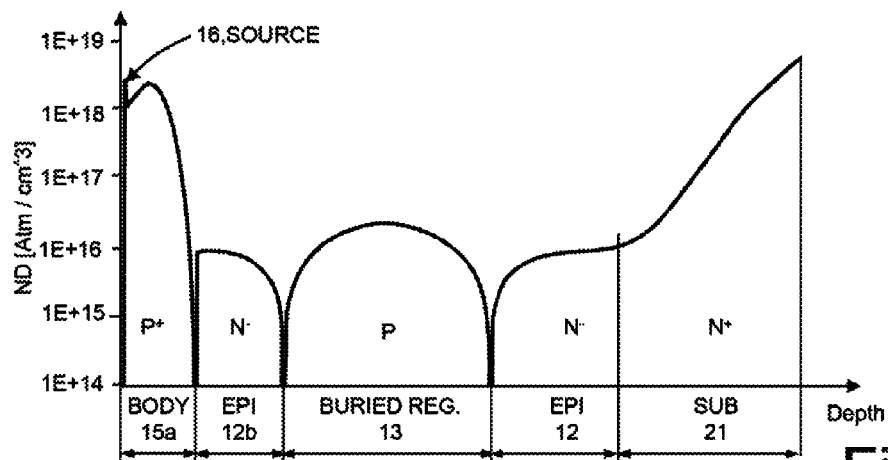
Fig.22
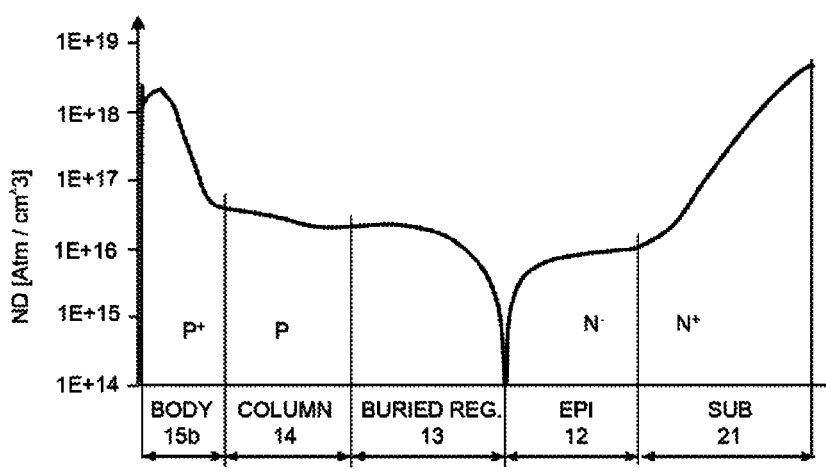
Fig.23

CHARGE-BALANCE POWER DEVICE COMPRISING COLUMNAR STRUCTURES AND HAVING REDUCED RESISTANCE, AND METHOD AND SYSTEM OF SAME

PRIORITY CLAIM

The present application is a Continuation-In-Part of co-pending U.S. patent application Ser. No. 12/134,050 filed Jun. 5, 2008 which claims the benefit of Italian Patent Application No. TO2007A000392, filed Jun. 5, 2007; all of the foregoing applications are incorporated herein by reference in their entireties.

TECHNICAL FIELD

One or more embodiments relate to a power device comprising columnar structures and having reduced resistance, and to the relating process for manufacturing such a power device.

An embodiment relates, in particular, but not exclusively, to a vertical-conduction power device (for example, a power MOS device or a device of the "Insulated-Gate Bipolar Transistor" (IGBT) type or a device of the "Bipolar Junction Transistor" (BJT) type, or bipolar diodes or Schottky diodes), and the following description refers to this field with the only purpose of simplifying exposition thereof.

BACKGROUND

Vertical-current MOSFET devices are used in various applications, such as DC/DC converters, devices for control and protection of batteries and lamps, and products for the automotive sector.

In particular, in the latter application, devices are typically required that are able to dissipate low amounts of heat even when they operate in high-current conditions. In practice, the device typically must present low source-drain on-resistance (Rdson), as well as the ability of withstanding a high reverse-biasing voltage (high BVdss).

In vertical-current devices of a planar type, the requisites corresponding to the two parameters referred to above (Rdson and BVdss) are in conflict in so far as to obtain a high reverse voltage it is necessary to increase the epitaxial thickness and/or to increase the resistivity of the epitaxial layer. In both cases, there is an increase in the Rdson since an increase in thickness determines a longer current path in the on state, and a greater resistivity of the epitaxial layer involves a higher resistance to the flow of current.

To reduce the source-drain on resistance it is possible to use a column structure that enables an increase in the body-drain perimeter so as to exploit the entire volume of the epitaxial layer. This technique enables the use of a more heavily doped epitaxial layer, thus one having lower resistivity, for a same reverse voltage, reducing the component of the Rdson due to the epitaxial layer (defined hereinafter as "epitaxial on resistance Repi").

An embodiment of a device having a column structure is illustrated in FIG. 1. In particular, FIG. 1 regards a device 1 of N-channel type having an epitaxial layer 3 of N type housing columns 2 of P type underneath body regions 4. Source regions 5 are formed within the body regions 4, and gate regions 6, of polysilicon, extend on top of the epitaxial layer 3, separated therefrom by respective gate-oxide layers 7. A metal region 8 electrically couples the source regions 5 and the body regions 4, and is electrically insulated from the gate regions 6 by insulating regions 9.

The columns 2 extend in a continuous way in the direction perpendicular to the plane of the drawing, for the entire length of the device, parallel to the body regions 4, to form strips or walls as illustrated in FIG. 2.

Embodiments of MOSFET devices with columnar structures are described in U.S. Pat. No. 6,630,698, US 2002/14671, and U.S. Pat. No. 6,586,798, which are incorporated by reference.

In devices with a columnar structure, it may be possible to obtain balance or compensation of charge between the dopant of the columns 2, of P type, and the charge of the epitaxial layer 3, of N type, so that the total charge of the columns 2 is equal and of opposite sign with respect to the total charge of the epitaxial layer 3. This condition involves complete depletion of the free carriers both in the epitaxial layer 3 and in the columns 2 so as to form a carrier-free area, which, behaving like an insulating layer, enables high values of reverse (breakdown) voltage, with an electrical field of almost uniform extension both in modulus and in direction through the entire region comprising the epitaxial layer 3 and the columns 2. In particular, it may be possible to bias the device so that the electrical field is close to the critical electrical field, which is the maximum electrical field that a PN junction can withstand at the interface, beyond which the process of avalanche conduction (breakdown) is triggered.

Using the principle of charge balance, it may thus be possible to choose a high dopant concentration in the epitaxial layer 3, appropriately balanced by the dopant in the columns 2. This choice may have, however, limits due to the need of calibrating the intercolumnar distance for ensuring complete depletion of the entire epitaxial region, including the columns 2. This distance depends upon the lithographic resolution obtainable with the specific used technology.

Thanks to the configuration of the strips that form the columns 2 (visible in FIG. 2), the current flow, indicated by the arrows 10 in the on state of the device 1, is thus confined between two contiguous columns 2 in conditions of partial depletion, as occurs in conduction.

The value of the epitaxial on-resistance Repi is thus determined by the columnar geometry, and hence by the volume of the epitaxial layer 3 traversed by the current flow comprised between two contiguous columns 2.

SUMMARY

According to an embodiment, a charge-balance power device formed is in an epitaxial layer having a first conductivity type and housing at least two columnar structures of a second conductivity type, which extend through the epitaxial layer. A first and a second surface region of the second conductivity type extend along the surface of the epitaxial layer on top of, and in contact with, a respective one of the columns, and a second and a third surface region of the first conductivity type extend within the first and the second surface region, respectively, facing the surface of the epitaxial layer. The columns extend at a distance from each other and are arranged staggered to one another with respect to a first direction and partially facing one another with respect to a second direction transversal to the first direction.

BRIEF DESCRIPTION OF THE DRAWINGS

For a better understanding of the concepts discussed herein, one or more embodiments are now described purely by way of non-limiting example and with reference to the attached drawings, wherein:

FIG. 3 is a perspective view of a MOS device according to an embodiment;

FIGS. 4-11 show perspective sections of one half of the device of FIG. 3 in successive manufacturing steps;

FIGS. 18-21 show different layouts of some regions of the device, according to some variants of the device of FIG. 3 according to other embodiments;

FIGS. 22 and 23 show the concentration profiles of the dopant elements along a line traversing a vertical column and along a vertical line intermediate between two columns of the device of FIG. 3;

DETAILED DESCRIPTION

Figure 1:
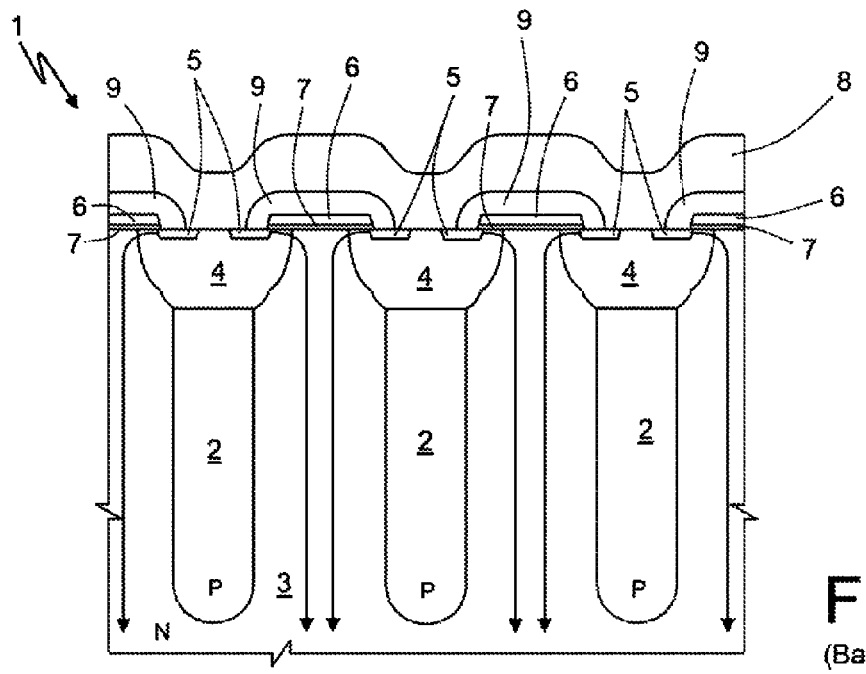
FIG. 1 is a cross-section of a known power MOS device.

The following discussion is presented to enable a person skilled in the art to make and use one or more embodiments. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

FIG. 3 shows a portion of an embodiment of a MOS device 11 of the charge-compensation type, comprising an epitaxial layer 12 of N type overlying a substrate 21 of N+ type. The epitaxial layer 12 has a surface 17, and the substrate 21 is in contact with a drain metallization (not illustrated).

A gate region 18, of polysilicon, extends on top of the surface 17 and is electrically insulated from the epitaxial layer 12 by a gate-oxide region 19. Body regions 15, of P+ type, extend within the epitaxial layer 12 on the two sides of the gate region 18 and accommodate source regions 16, of N type, facing the surface 17. In practice, the body regions 15 comprise buried body portions 15a extending underneath the source regions 16, and surface body portions 15b extending laterally with respect to the source regions 16, so that, in top plan view, the surface portions 15b alternate with the source regions 16. Furthermore, in an embodiment, the source regions 16 on one side of the gate region 18 are longitudinally staggered (in the direction Z) with respect to the source regions 16, arranged on the opposite side of the gate region 18. Likewise, the surface body portions 15b extending on one side of the gate region 18 are staggered with respect to the surface body portions 15b extending on the opposite side of the gate region 18.

Columns 14, of P type, extend vertically within the epitaxial layer 12, from the body regions 15 until buried regions 13, also of P type. In detail, the columns 14 are vertically aligned to the surface body portions 15b and thus are staggered with respect to the source regions 16. In an embodiment, buried regions 13, extend, in the form of strips, within the epitaxial layer 12, for example, for the entire length, in the direction Z, of the MOS device 11, aligned vertically to the body regions 15. In practice, in the example illustrated, the buried regions 13 are substantially congruent with the body regions 15. Moreover, two or more columns 14 with rectangular-base area extend, at a distance from one another, between a body region 15 and the underlying buried region 13 on either side of the gate region 18. The portion of epitaxial layer 12 extending underneath the gate region 18 forms a central epitaxial portion 12a, and the portion of the epitaxial layer 12 comprised between two adjacent columns 14, arranged on a same side of the gate region 18, forms a lateral epitaxial portion 12b.

The columns 14 aligned in the direction Z are arranged at a mutual distance E and have a length, in the direction X perpendicular to the extension direction Z of the buried regions 13, equal to B. The thickness of the buried regions 13 is equal to C, the total length of each buried region 13 is equal to A, and the distance in the direction X between the buried regions 13 is equal to L. Finally, the height of the columns 14 is equal to D-C, where D is the distance between the respective surfaces, facing the substrate 21, of the buried region 13 and the body region 15.

Figure 2:
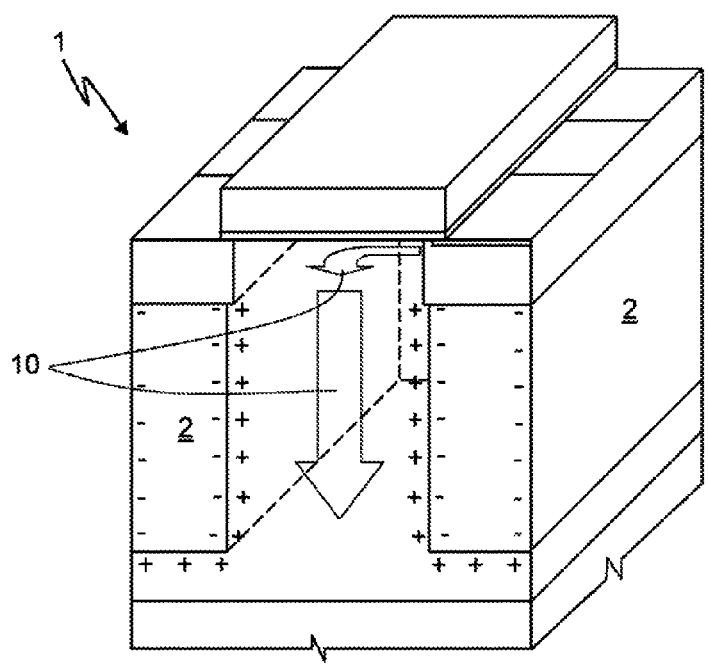
FIG. 2 is a perspective view of a part of the known device of FIG. 1.
Figure 6:
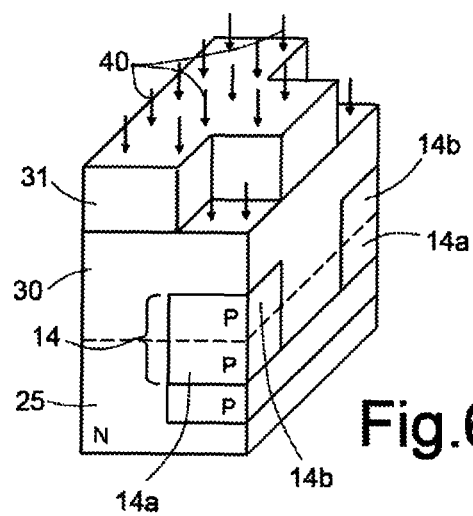
Figure 7:
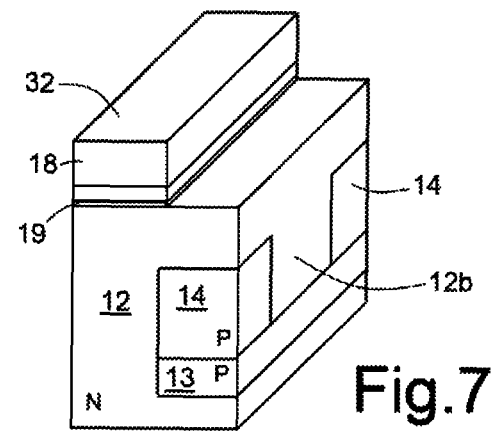
Figure 8:
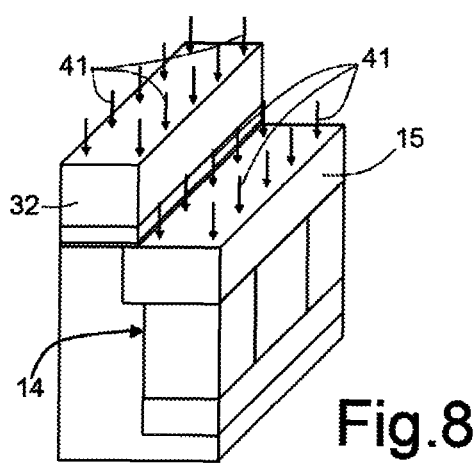

In the device 11 of FIG. 3, like the device 1 of FIG. 2, the epitaxial layer 12 accommodates first electric charges of N type defining a first charge level, and the columns 14 accommodate second electric charges of P type distributed in a spatially uniform way and defining a second charge level compensating the first charge level.

For a same resistivity p of the epitaxial layer 3 (corresponding to the layer 12 in FIG. 3, the epitaxial on-resistance Repi3 of the structure of FIG. 3 is lower than the epitaxial on-resistance Repi1 of the structure of FIG. 1 since the on-resistance due to the portion 12a of the epitaxial layer 12 is in parallel to the on-resistance due to the portion 12b of the epitaxial layer 12. In detail, with reference to FIGS. 1 and 3:

$$Repi1 = \rho \frac{D}{AL} \quad (1)$$

$$Repi3 = (RcRl)/(Rc + Rl) \quad (2)$$

where $$Rc = Repi1 = \rho \frac{D}{AL} \quad (3)$$

is the resistance of the central epitaxial portion 12a, and $$Rl = \rho \frac{D-C}{BE} \quad (4)$$

is the resistance of the lateral epitaxial portion 12b. It follows that $$Repi3 = Repi1 \left[ \frac{1}{1 + \frac{2BED}{AL(D-C)}} \right] \quad (5)$$

From Eq. (5) it is evident that the epitaxial on-resistance Repi3 of the structure of FIG. 3 is always lower than that of the structure of FIG. 1, for same overall dimensions, thanks to the presence of a number of current paths passing both through the central epitaxial portion 12a and through the lateral epitaxial portion 12b.

For example, if A=4.8 μm, L=2 μm, E=1.6 μm, and D=4 μm, a gain (i.e., a decrease in the epitaxial on resistance) of approximately 18% is obtained. In general, in an embodiment it may be possible to obtain a gain on the total resistance comprised between approximately 14% and 18%.

A doping example of the structure of FIG. 3 is illustrated in FIGS. 22 and 23, which show the doping profile in the vertical direction at a column 14 and, respectively, of the portion 12b of the epitaxial layer 12 comprised between two columns 14, where an additional diffusion has been used for the buried regions 13 so as to lengthen the columns 14 towards the substrate 21, causing a shortening of the top part of the epitaxial region 12b. In fact, the vertical extension of the epitaxial region 12b and of the buried region 13 may be varied according to the class of voltage of the device.

As may be noted from FIG. 3, in the example considered, the buried region 13 has a doping level which is approximately equal to that of the overlying column 14.

The MOS device 11 of FIG. 3 is obtained or manufactured, as described hereinafter and represented in FIGS. 4-11, which show only one half of the MOS device 11 (the other half of the device may be formed in a similar manner during the same corresponding manufacturing steps as the illustrated half of the device).

Initially (FIG. 4), a bottom epitaxial layer 25 of N type is grown on the substrate 21 (not illustrated), and the bottom epitaxial layer 25 is covered by a first resist mask 26. A high-energy implant of P type is then performed (represented by the arrows 27) so as to inject the dopant agents in depth, obtaining the buried regions 13 still overlaid by a portion of the bottom epitaxial layer 25.

Then (FIG. 5), after removing the first resist mask 26 and cleaning the wafer, a second resist mask 28 is formed, which covers the surface of the bottom layer 25 except where the columns 14 are to be provided. Then, a second implant of P type follows, as represented by the arrows 29, so as to form bottom parts 14a of the columns 14.

Next (FIG. 6), after removing the second resist mask 28 and cleaning the wafer, a top epitaxial layer 30 is grown, which forms, together with the bottom epitaxial layer 25, the epitaxial layer 12 of FIG. 3. The epitaxial layer 12 is covered by a resist mask 31, and a high-energy implant of P type is then performed (arrows 40) so as to form top parts 14b of the columns 14, contiguous and vertically aligned with the bottom parts 14a. The epitaxial growth, resist masking, and dopant implant may be repeated a number of times until the height corresponding to the voltage class of the device is reached or in order to obtain a greater depth and uniformity of doping of the columns 14. In this case, the individual implantation steps are performed so as to implant the entire depth of the intermediate epitaxial layers.

Then (FIG. 7), a gate-oxide layer and a polysilicon layer are formed in sequence, and are defined using a resist mask 32 to obtain the gate region 18 and the gate oxide region 19.

Next (FIG. 8), using the same resist mask 32, an implant of dopant agents of P type is performed (arrows 41), for forming the body regions 15, which extend in depth until they are in contact with the columns 14.

Figure 9:
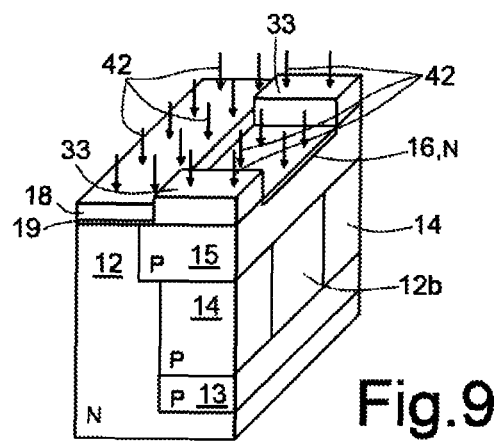

After removing the resist mask 32, the epitaxial layer 12 is again covered by a resist mask 33 so as to leave exposed only the portions where it is desired to form the source regions 16, and the corresponding implant of N type is performed, as represented in FIG. 9 by the arrows 42.

Figure 10:
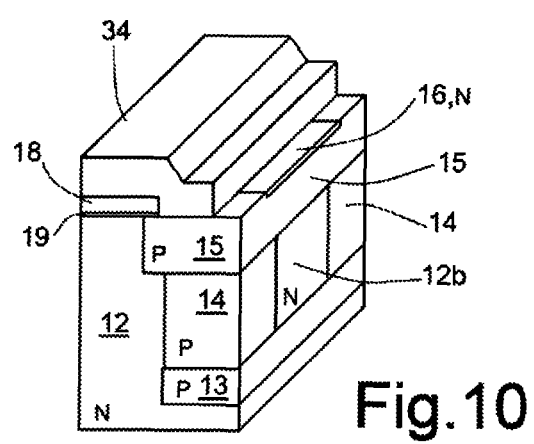

Next, an insulation layer 34 of dielectric material is deposited on the structure thus obtained and then defined, so as to uncover part of the source 16 and body 15 regions, to obtain the structure of FIG. 10.

Figure 11:
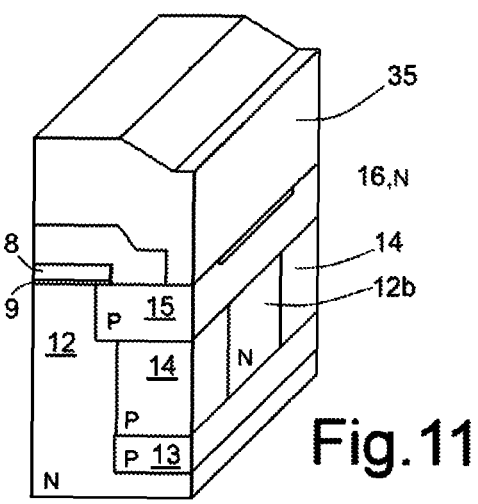

Finally, a metal layer 35 is deposited and defined so that the final structure of FIG. 11 is obtained.

FIGS. 12-17 show different embodiments, which differ as regards the configuration and/or position of the columnar structures.

Figure 12:
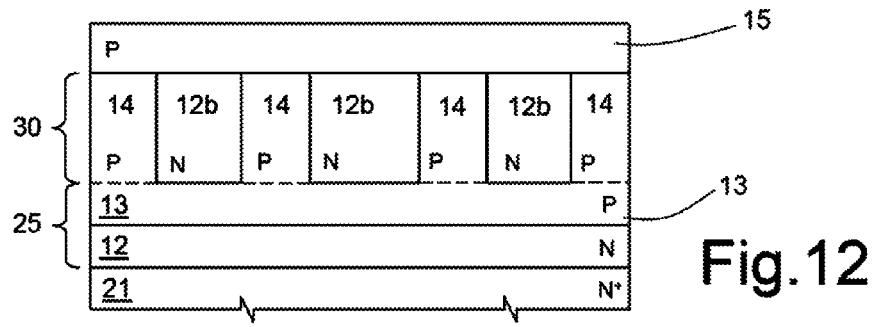
FIGS. 12-17 show cross-sections of variants of the device of FIG. 3, taken along a plane parallel to the axes Y and Z.

In detail, FIG. 12 regards an embodiment wherein the buried regions 13 are implanted so as to extend up to the top surface of the bottom epitaxial layer 25. Then, the top epitaxial layer 30 is grown and selectively implanted so as to form the entire columns 14. The process proceeds with the steps described above, including forming the gate regions (not illustrated), the body regions 15 (so as to obtain the structure of FIG. 12), as well as the source and metal regions.

Alternatively, and in a way not illustrated, instead of forming a single top epitaxial layer 30, it may be possible to grow two top epitaxial layers (not illustrated), within which portions (respectively bottom and top) of the columns 14 are formed.

Figure 13:
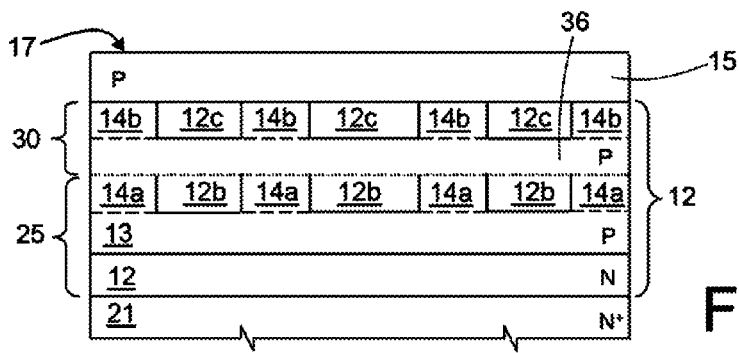

In the structure of FIG. 13, after the steps of growing the bottom epitaxial layer 25, first high-energy implanting to form the buried regions 13, selective implanting to form the bottom portions 14a, and growing the top epitaxial layer 30, as in the embodiment of FIGS. 4-11, a second high-energy implanting is performed so as to form intermediate portions 36, set on top of, and aligned to, the deep regions 13 and coupled to the latter by the bottom portions 14a. Then, a second selective implant is performed to form the top portions 14b of the columns. Thereby, the intermediate portions 36 extend at a distance from the surface 17 of the epitaxial layer 12 and, together with the bottom portions 14a and the top portions 14b of the columns, form, in side view, a grid structure, wherein epitaxial regions 12b, 12c, of N type, are surrounded on four sides by P type regions (including also the body regions 15). In this embodiment, the insertion of the intermediate portions 36 enables conservation of the charge balance.

Figure 14:
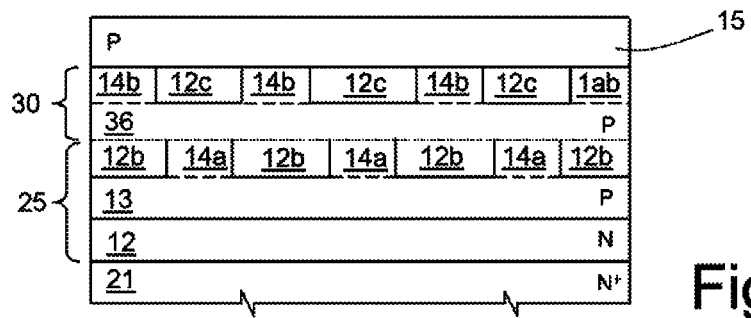

FIG. 14 shows an embodiment wherein the epitaxial regions 12b, 12c are staggered, thanks to the selective implants for forming the bottom 14a and top 14b portions, staggered with respect to one another. In this case, in practice, no linear-structure columns 14 are provided, but columnar structures having a step-like structure and formed by a number of portions staggered with respect to one another. Also in this case, a P type structure is obtained having a grid-like shape in side view.

Figure 15:
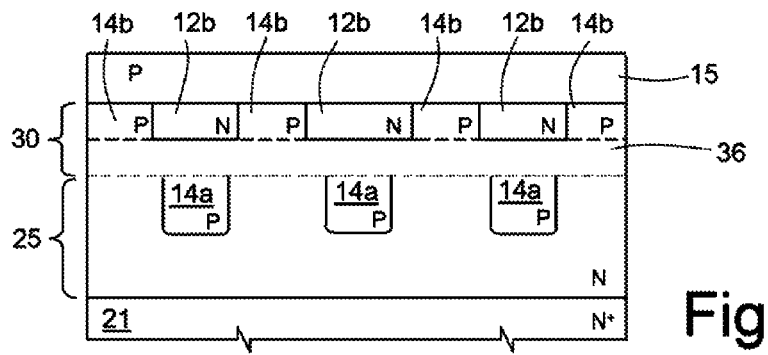

In the embodiment of FIG. 15, the high-energy implant is not performed in the bottom epitaxial layer 25, but only the selective implant is performed for forming the bottom portions 14a of the columnar structures. Furthermore, like FIG. 14, a high-energy implant is made in the top epitaxial layer 30 to form the intermediate portion 36, and a localized implant is made to form the top portions 14b. In this case, then, once again a grid-like structure of P type is obtained, but the bottom portions 14a are contiguous and surrounded on five sides by the bottom part of the bottom epitaxial layer 25 of N type.

Figure 16:
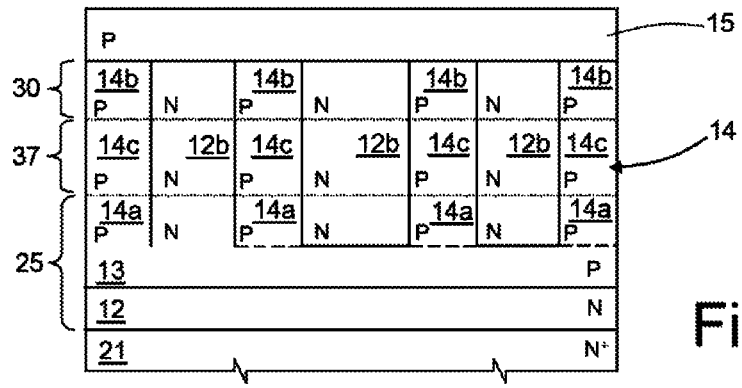

In the embodiment of FIG. 16, three epitaxial growths are performed, namely after growing the bottom epitaxial layer 25, high-energy implanting for forming the deep regions 13, selective implanting for forming the bottom portions 14a, an intermediate epitaxial layer 37 is grown, a selective implant is performed to form intermediate portions 14c of the columns 14, the top epitaxial layer 30 is grown, and a localized implant is made to form the top portions 23b. In this embodiment, the selective implants for forming the portions 14a, 14b and 14c are aligned with respect to one another, so as to form columns 14 of a linear type. Alternatively, analogously to the embodiments of FIGS. 14 and 15, the localized implants in the intermediate epitaxial layer 37 and/or in the top epitaxial layer 30 may be staggered, in which case a high-energy implant is also made to form coupling regions between the portions 14a-14c of the columnar structures.

Figure 17:
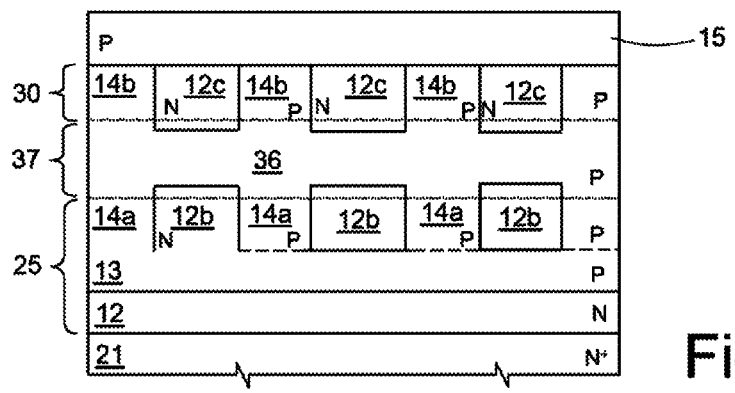

In FIG. 17, three epitaxial growths are again performed, but the intermediate epitaxial layer 37 is subjected to an implant for forming the intermediate region 36. In this way, a structure similar to that of FIG. 13 is obtained, avoiding high-energy implants, but using one epitaxial growth more.

FIGS. 18-21 show different embodiments, which differ as regards the layout of the deep regions 13 and/or of the columns 14 as compared to FIG. 3.

Figures 18, 19:
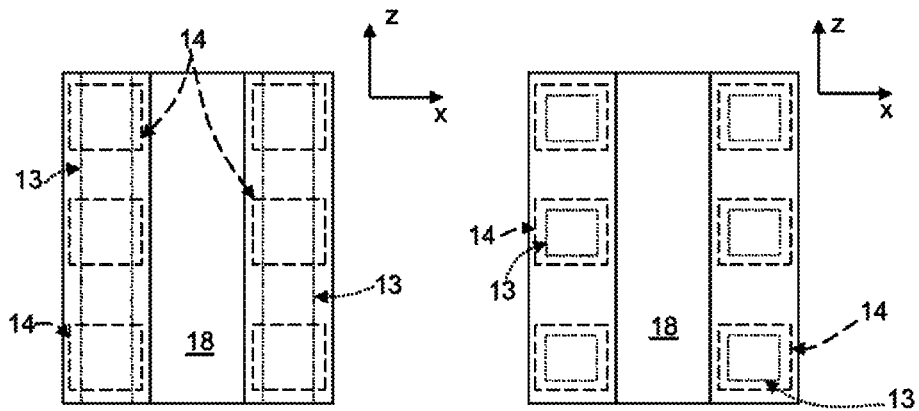

In the embodiment of FIG. 18, the deep regions 13 are formed by strip-like structures, similar to those of FIG. 3, and the columns 14 are aligned in directions perpendicular to the strips 13 (parallel to the axis X). Also in this case, the source regions 16 (not illustrated) are arranged in the space between adjacent columns and are thus aligned with respect to one another also in a direction parallel to the axis X. However, a slight overstepping of the source regions 16 (not illustrated) on top of the columns 14, but not in electrical contact therewith, does not jeopardize operation of the device.

In FIG. 19, the buried regions 13 are provided by discrete portions, aligned vertically to the columns 14 and of slightly smaller area. In practice, a number of deep regions 13, of polygonal (rectangular or square) shape, or some other shape, extend on both sides of the gate region 18, aligned with respect to one another in the directions X and Z.

In FIG. 20, the deep regions 13 have a strip-like shape, similar to those of FIG. 3, and the columns 14 have a strip-like shape and extend obliquely with respect to the deep regions 13, also underneath the gate region 18.

In FIG. 21, the columns 14 extend, in top plan view, perpendicular to the deep regions 13, also here passing underneath the gate regions 18.

Figure 24:
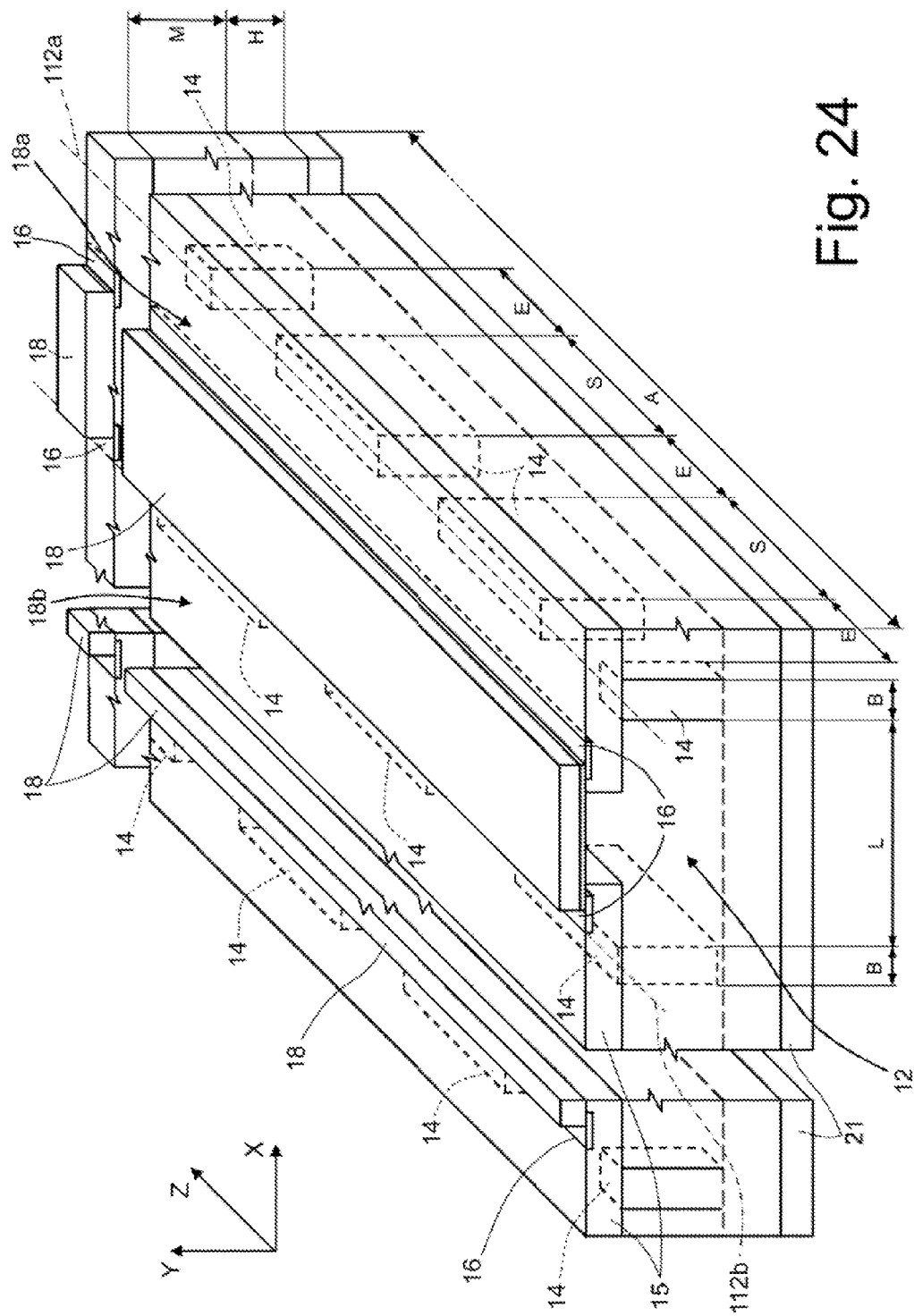
FIG. 24 is a perspective view of a MOS device according to another embodiment.

FIG. 24 shows a portion of a MOS device 110 according to an embodiment. The portion of the MOS device 110 of FIG. 24 is analogous to the portion of the MOS device 11 shown in FIG. 3 and is described with reference to that figure (common features are indicated with the same reference numbers).

The MOS device 110 is of the charge-compensation type, and comprises the epitaxial layer 12 of N type overlying the substrate 21, of N+ or N++ type, which is in contact with a drain metallization (not illustrated). The gate region 18, made of N-doped polysilicon, extends on top of the surface 17 of the epitaxial layer 12 and is electrically insulated from the epitaxial layer 12 by the gate-oxide region 19. The body regions 15, of P or P+ type, extend within the epitaxial layer 12, respectively on a first and a second side 18a, 18b of the gate region 18, and each accommodates a source region 16, of N type. The body regions 15 include buried body portions 15a, extending underneath the source regions 16. In an embodiment, the source regions 16 on both sides 18a, 18b of the gate region 18 extend, along the direction of the Z axis, for the whole length of body regions 15 (or gate region 18). Alternatively, source regions 16 may be arranged such that, in top plan view, they alternate with surface portions 15b of the body regions 15, analogously to the embodiment of FIG. 3.

Columns 14, of P type, extend vertically within the epitaxial layer 12, from the body regions 15 towards the substrate 21 in the direction of the Y axis. More particularly, the columns 14 extend within the epitaxial layer 12 at a distance H from the substrate 21. The distance H may be chosen so as to approximately optimize the breakdown voltage, and, for example, may be in a range of approximately 1 μm to 150 μm, and may vary according to the breakdown voltage class of the device.

According to the embodiment of FIG. 24, the buried regions 13 shown in FIG. 3 are not present. The absence of the buried regions 13 leads to an increase of the area of the epitaxial layer 12 during current conduction, and consequently to a reduction of the epitaxial on-resistance Repi4 of the MOS device 110.

In detail, the columns 14 have a square- or rectangular-shaped base area, and are aligned, along the Y and Z axes, to the body portions 15 on both sides of the gate region 18. According to the shape of the base area, the columns 14 may have the form of a wall. It is apparent that the columns 14 may have a base area differently shaped, for example rectangular with rounded corners, or circular, or generally polygonal, or even other shapes.

Two or more columns 14 extend through the epitaxial layer 12 between a respective body region 15 and the substrate 21, at a mutual distance L from one another along the X axis. Furthermore, other columns 14 extend through the epitaxial layer 12 between a respective body region 15 and the substrate 21, arranged at a mutual distance E from one another along the Z axis. According to an embodiment, the value of E is approximately equal to the value of L. The portion of epitaxial layer 12 extending underneath the gate region 18 forms a central epitaxial portion 12a, and the portion of the epitaxial layer 12 comprised between two adjacent columns 14, arranged on a same side 18a, 18b of the gate region 18, forms a lateral epitaxial portion 12b.

The columns 14 have a thickness, in the direction of the X axis, approximately equal to B, wherein B is, for example, in the range of approximately 1 to 20 μm; the distance L between two columns 14 in the direction of the X axis is, for example, in the range of approximately 1 to 40 μm; finally, the height M of each column 14 is, for example, in the range of approximately 1 to 100 μm. The length of each column 14 in the direction Z is referenced in FIG. 24 and FIG. 25 as S, which is, for example, in the range of approximately 1 to 40 μm.

Figure 25:
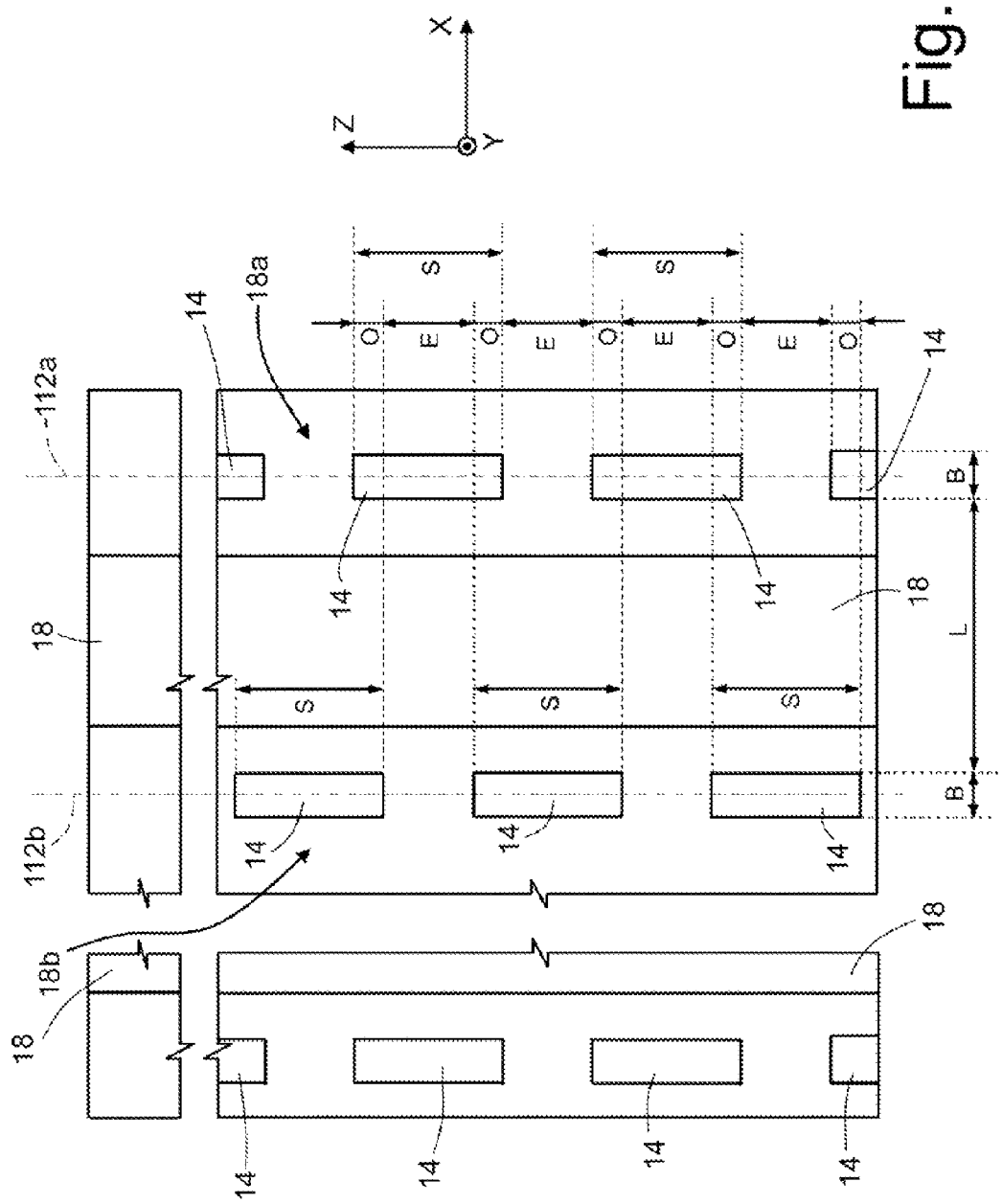
FIG. 25 is a schematic top view of some regions of the device of FIG. 24, taken along a plane parallel to the axes X and Z.

The columns 14 of the MOS device 110 are staggered along the Z axis. This also means that columns 14 arranged on a same (first or second) side 18a, 18b are not perfectly aligned, along the direction of the Z axis, to the columns 14 arranged on the other (second or first) side 18b, 18a. FIG. 25 is a top plan view of the portion of MOS device 110 of FIG. 24, in particular showing the respective arrangement of columns 14.

As shown in FIG. 25, columns 14 arranged on a same first and second side 18a, 18b of the gate region 18 are substantially aligned along a same respective direction 112a, 112b that is approximately parallel to the Z axis; moreover, columns 14 arranged on the first side 18a, are staggered with respect to the columns 14 arranged on the second side 18b along a direction parallel to the Z axis. Moreover, each column 14 on the first side 18a may partially face, along the direction of the X axis, at least one column 14 on the second side 18b (see the overlapping region having a length O in FIG. 24 and FIG. 25). In other words, columns 14 arranged on the first side 18a (second side 18b) are substantially aligned, along the direction of the X axis, with a respective lateral epitaxial portion 12b delimited by two columns 14 arranged on the second side 18b (first side 18a), provided that a partial facing between columns 14 on different sides 18a, 18b may be present. The degree of facing or overlapping, along direction X, of columns 14 arranged on opposite sides 18a, 18b may be chosen in such a way to optimize the charge balance in each column 14 and in the epitaxial layer 12 around the columns 14. It has been found that approximately optimum results may be achieved when the length O has a value approximately equal to S/4. However, other values may be chosen for the length O, for example values in a neighborhood of S/4, wherein S is, as said, the length of each column 14 in the direction Z. If two partially facing columns 14 have different lengths S, then the value of O may be one-fourth of the smaller between the two values of S.

The segmentation of columns 14 along the direction Z may provide for an increase in the volume of the epitaxial layer 12 through which the drain-source current flows, and moreover may allow for an increase of the breakdown voltage. The staggering of the columns 14 along the direction Z may provide for an approximate maximization of the conduction area at each point of the epitaxial layer 12. The partial facing, along the direction X, of columns 14 arranged at opposite sides 18a, 18b of the gate region 18 may provide for an approximately optimization of the charge balance, as previously described.

The epitaxial on-resistance Repi4 of the MOS device 110 may be reduced with respect to that of known MOS device (as of FIG. 1). For a same resistivity ρ of the epitaxial layer 3 (which corresponds to the layer 12 of FIGS. 24-25), the epitaxial on-resistance Repi4 of the structure of FIG. 24 may be lower than the epitaxial on-resistance Repi1 of the structure of FIG. 1 since the on-resistance due to the portion 12a of the epitaxial layer 12 is in parallel to the on-resistance due to the portion 12b of the epitaxial layer 12. In detail, with reference to FIGS. 1 and 24:

$$Repi4 = (RcRl)/(Rc + Rl) \qquad (6)$$

where $$Rc = Repi1 = \rho \frac{M}{AL} \qquad (7)$$

is the resistance of the central epitaxial portion 12a, and $$Rl = \rho \frac{M}{BE} \qquad (8)$$

is the resistance of the lateral epitaxial portion 12b of the MOS device 110. It follows that $$Repi4 = Repi1 \left[ \frac{1}{1 + \frac{kBE}{AL}} \right] \qquad (9)$$

where k is the total number of lateral epitaxial portions 12b of the considered MOS device (with reference to FIG. 24, four lateral epitaxial portions 12b are represented).

From Eq. (9) it is evident that the epitaxial on-resistance Repi4 of the structure of FIG. 24 is always lower than that of the structure of FIG. 1, for same overall dimensions, doping profiles, etc., thanks to the presence of a number of current paths passing both through the central epitaxial portion 12a and through the lateral epitaxial portion 12b.

The manufacturing process of the MOS device 110 is analogous to the process described with reference to the MOS device 11 of FIG. 3, provided that the buried regions 13 are not formed.

Finally, it is evident that modifications and variations may be made to the device and process of fabrication described herein, without thereby departing from the scope of the present disclosure.

For example, the columns 14 may be provided in different epitaxial layers arranged on top of one another, as described above, or else only in the top epitaxial layer 30 (as in FIG. 12). Alternatively, the columns 14 may be provided only in the bottom epitaxial layer 25, in which case the body regions 15 extend throughout the thickness of the top epitaxial layer 30.

Furthermore, the source regions 16 may be aligned with respect to one another in the direction X on the two sides of the gate region 18, and, likewise, the surface body portions 15a may be aligned with respect to one another in the direction X on the two sides of the gate region 18, analogously to FIG. 18, also in the case of columnar structures of a different type, as in FIGS. 13-17.

Devices as described above and according to other embodiments may be utilized in a variety of different types of electronic systems, such as DC-DC voltage converters, devices for the control and protection of batteries and lamps, and automotive devices. In such a system, the device may be coupled to, or otherwise controlled by, a control circuit such as, or including, a processor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A charge-balance power device, comprising:
   a semiconductor body having a first conductivity type and a surface;
   a first and a second columnar structure of a second conductivity type, each columnar structure extending through said semiconductor body;
   a first surface region of the second conductivity type, extending along said surface, on top of and in contact with said first columnar structure;
   a second surface region of the second conductivity type, extending along said surface at a distance from the first surface region, on top of and in contact with said second columnar structure;
   a third surface region of the first conductivity type, extending within the first surface region and facing said surface;
   a fourth surface region of the first conductivity type, extending within the second surface region and facing said surface,
   wherein the first and the second columnar structures extend at a distance from each other and are arranged staggered to one another with respect to a first direction and partially facing one another with respect to a second direction transversal to the first direction.

2. The power device according to claim 1, wherein the first and the second columnar structure have a respective extension parallel to the first direction, the first and the second columnar structure partially facing one another along the second direction at respective portions having a length, along the first direction, of about one-fourth of the shorter among said extensions of the first and the second columnar structure.

3. The power device according to claim 1, further comprising a third columnar structure extending through the semiconductor body from the first surface region, at a distance from and aligned to the first columnar structure along the first direction, the first and the third columnar structure defining a region of said semiconductor body comprised between them having an extension, parallel to the first direction, shorter than the extension, parallel to the first direction, of the second columnar structure.

4. The power device according to claim 3, wherein the length, along the first direction, of the portion of the semiconductor body comprised between the first and the third columnar structure, is equal to the length of the distance between the first and the second columnar structure along said second direction.

5. The power device according to claim 1, and forming a MOS transistor, comprising:
at least one insulated gate region extending on top of said epitaxial layer, between the first and the second surface regions;
wherein the first and the second surface region form a body region, and the third and the fourth surface region form source regions.

6. The power device according to claim 1, wherein the semiconductor body accommodates first electric charges defining a first charge level and the columnar structures accommodate second electric charges distributed in a spatially uniform way.

7. The power device according to claim 6, wherein the second electric charges locally compensate the first charge level.

8. A process for manufacturing a charge-balance power device, comprising the steps of:
forming a semiconductor body having a first conductivity type;
forming, in said semiconductor body, a first and a second columnar structure having a second conductivity type;
forming, in said semiconductor body, a first surface region having the second conductivity type;
forming, in said semiconductor body, a second surface region having the second conductivity type
forming, within said first surface region, a third surface region of the first conductivity type;
forming, within said second surface region, a fourth surface region of the first conductivity type,
wherein the step of forming the first and the second surface region comprises introducing dopant species so that the first surface region extends on top of and in contact with the first columnar structure, and the second surface region extends on top of and in contact with the second columnar structure, and wherein the step of forming the first and the second columnar structure comprises forming the first and the second columnar structure staggered to one another with respect to a first direction, and partially facing one another with respect to a second direction transversal to the first direction.

9. The process according to claim 8, wherein the step of forming the first columnar structure comprises introducing, in the semiconductor body, dopant species having the second conductivity type, in such a way to form the first and the second columnar structure having a respective extension parallel to the first direction, and partially facing one another along the second direction at respective portions having a length, along the first direction, of about one-fourth of the shorter among said extensions.

10. The process according to claim 8, further comprising, before the step of forming the first surface region, the step of forming, in said semiconductor body at a distance from the first columnar structure, a third columnar structure of the second conductivity type, in such a way to define a region of said semiconductor body comprised between the first and the third columnar structure having an extension, parallel to said first direction, shorter than the extension, parallel to the first direction, of the second columnar structure, and wherein the step of forming the first surface region further comprises introducing dopant ions so that the first surface region extends on top of and in contact with the third columnar structure.

11. The process according to claim 8, comprising:
forming an insulated gate region on top of the body of semiconductor material so that the first and third columnar structure extend on a first side of said insulated gate region and the second columnar structure extends on a second side, opposite to the first side, of said insulated gate region;
introducing dopant species so as to form the first surface region on the first side of said insulated gate region and the second surface region on the second side of said insulated gate region, the first and the second surface regions being body regions of a MOS device; and
introducing dopant species so as to form the third surface region within the first surface region and the fourth surface region within the second surface region, the third and the fourth surface regions being source regions.

12. A power device, comprising:
a substrate having a first conductivity type;
a semiconductor layer formed on the substrate and having the first conductivity type and first and second surfaces, the second surface being defined as the junction between the semiconductor layer and the substrate;
a first and a second body region having a second conductivity type formed in the semiconductor layer spaced apart from one another and extending at the first surface of the semiconductor layer;
source regions formed in the body regions;
a first and a second columnar structure, spaced apart from one another, formed in the semiconductor layer, the first and the second columnar structure being staggered to one another with respect to a first direction, and partially facing to one another with respect to a second direction transversal to the first direction, each one of the columnar structures having the second conductivity type and extending from a respective first and second body region towards the second surface of the semiconductor layer;
a gate structure formed on the first surface of the semiconductor layer and being positioned between and partially overlapping the first and second body region; and
a drain contact formed on a surface of the substrate opposite the surface on which the semiconductor layer is formed.

13. The power device of claim 12, further comprising a plurality of columnar structures extending from a respective first and second body region towards the second surface of the semiconductor layer, wherein the columnar structures extending from the first body region and the second body region are staggered to one another with respect to the first direction.

14. The power device of claim 12, wherein the semiconductor layer comprises an epitaxial layer.

15. The power device of claim 12, wherein the first conductivity type is n-type and the second conductivity type is p-type.

16. An electronic system, comprising:
electronic circuitry operable to perform a desired function, the electronic circuitry including at least one power device and at least some of the power devices comprising,
a substrate having the first conductivity type;
a semiconductor layer formed on the substrate and having the first conductivity type and first and second surfaces, the second surface being defined as the junction between the semiconductor layer and the substrate;

a first and a second body region having a second conductivity type formed in the semiconductor layer spaced apart from one another and extending at the first surface of the semiconductor layer;
source regions formed in the body regions;
a first and a second columnar structure, spaced apart from one another, formed in the semiconductor layer, the first and the second columnar structure being staggered to one another with respect to a first direction, and partially facing to one another with respect to a second direction transversal to the first direction, each one of the columnar structures having the second conductivity type and extending from a respective first and second body region towards the second surface of the semiconductor layer;
a gate structure formed on the first surface of the semiconductor layer and being positioned between and partially overlapping the first and second body region; and
a drain contact formed on a surface of the substrate opposite the surface on which the semiconductor layer is formed.

17. The electronic system of claim 16 wherein the electronic circuitry comprises automotive circuitry.

18. A method of forming a power device in a semiconductor, comprising:
a substrate having the first conductivity type;
a semiconductor layer formed on the substrate and having the first conductivity type and first and second surfaces, the second surface being defined as the junction between the semiconductor layer and the substrate;
a first and a second body region having a second conductivity type formed in the semiconductor layer spaced apart from one another and extending at the first surface of the semiconductor layer;
source regions formed in the body regions;
a first and a second columnar structure, spaced apart from one another, formed in the semiconductor layer, the first and the second columnar structure being staggered to one another with respect to a first direction, and partially facing to one another with respect to a second direction transversal to the first direction, each one of the columnar structures having the second conductivity type and extending from a respective first and second body region towards the second surface of the semiconductor layer;
a gate structure formed on the first surface of the semiconductor layer and being positioned between and partially overlapping the first and second body region; and
a drain contact formed on a surface of the substrate opposite the surface on which the semiconductor layer is formed.

19. A device, comprising:
a gate region having first and second opposite sides;
first and second body regions having a first conductivity type and respectively disposed beneath the first and second sides of the gate region;
first and second source regions having a second conductivity type and respectively disposed in the first and second body regions;
first and second column regions having the first conductivity type, respectively disposed beneath one of the first and second body regions, and offset from one another; and
a first drain region having the second conductivity type and having a first portion disposed beneath the gate region and having a second portion disposed directly beneath one of the first and second source regions, the second portion further disposed between the first and second column regions.

20. The device of claim 19, further comprising an insulating region disposed between the gate region and the first and second body regions.

21. The device of claim 19, wherein:
the first conductivity type comprises P-type conductivity; and
the second conductivity type comprises N-type conductivity.

22. The device of claim 19, wherein:
the first conductivity type comprises N-type conductivity; and
the second conductivity type comprises P-type conductivity.

23. The device of claim 19 wherein the first and second source regions are respectively disposed beneath the first and second sides of the gate region.

24. The device of claim 19 wherein the drain region is disposed between the first and second body regions.

25. The device of claim 19, further comprising first and second buried regions having the first conductivity type and respectively disposed beneath the first and second column regions.

26. The device of claim 19, further comprising first and second buried regions having the first conductivity type, respectively disposed beneath the first and second column regions, and respectively aligned with the first and second body regions.

27. The device of claim 19, further comprising:
an epitaxial layer; and
wherein the first and second body regions, the first and second column regions, and the drain region are disposed in the epitaxial layer.

28. The device of claim 19, further comprising:
a substrate having the second conductivity type;
an epitaxial layer disposed over the substrate; and
wherein the first and second body regions, the first and second column regions, and the drain region are disposed in the epitaxial layer.

29. The device of claim 19, further comprising a substrate having the second conductivity type, disposed beneath the first drain region, and forming a second drain region.

30. The device of claim 19, further comprising:
wherein one of the first and second column regions comprises a first portion and a second portion disposed beneath the first portion; and
an intermediate region having the first conductivity and disposed between the first and second portions of the one of the first and second column regions.

31. The device of claim 19 wherein one of the first and second column regions comprises a first portion and a second portion disposed beneath and offset from the first portion.

32. The device of claim 19 wherein the first column region comprises a first portion and a second portion disposed beneath and aligned with the first portion.

33. The device of claim 19, further comprising a third column region disposed beneath the first body region and spaced from the first column region.

34. The device of claim 19, further comprising:
a third column region disposed beneath the first body region and spaced from the first column region; and
wherein the first drain region is disposed between the first and third column regions.

35. The device of claim 19, further comprising:
a third column region disposed beneath the first body region and spaced from the first column region;
a fourth column region disposed beneath the second body region and spaced from the second column region; and wherein the first drain region is disposed between the first and third column regions and between the second and fourth column regions.

36. The device of claim 19 wherein a portion of the first column region overlaps a portion of the second column region.

37. The device of claim 19 wherein:
the first column region has a width; and
a portion of the first column having approximately one quarter of the width overlaps a portion of the second column.

38. The device of claim 19 wherein:
the first and second column regions respectively have first and second widths; and
a portion of the first column region having approximately one quarter of the first width overlaps a portion of the second column region having approximately one quarter of the second width.

39. The device of claim 19, further comprising:
a third column region disposed beneath the first body region and spaced from the first column region; and
wherein the first and third column regions overlap respective portions of the second column region.

40. The device of claim 19, further comprising:
a third column region disposed beneath the first body region and spaced from the first column region;
wherein the first, second, and third column regions respectively have first, second, and third widths;
wherein a portion of the first column region having approximately one quarter of the first width overlaps a first portion of the second column region having approximately one quarter of the second width; and
wherein a portion of the third column region having approximately one quarter of the third width overlaps a second portion of the second column region having approximately one quarter of the second width.

41. The device of claim 19, further comprising a conductive gate contact disposed over the gate region.

42. The device of claim 19, further comprising a conductive source contact disposed over the first and second source regions.

43. The device of claim 19, further comprising a conductive source contact disposed over the first and second source regions and over portions of the first and second source regions beyond the first and second source regions.

44. The device of claim 19, further comprising a conductive drain contact disposed beneath the first drain region.

45. The device of claim 19 wherein the first and second column regions have rectangular cross sections.

46. The device of claim 19 wherein the first and second column regions have non rectangular cross sections.

47. An integrated circuit, comprising:
a device, including
a gate region having first and second opposite sides;
first and second body regions having a first conductivity type and respectively disposed beneath the first and second sides of the gate region;
first and second source regions having a second conductivity type and respectively disposed in the first and second body regions;
first and second column regions having the first conductivity type, respectively disposed beneath the first and second body regions, and offset from one another;
a third column region having the first conductivity type and disposed beneath one of the first and second body regions;
a first drain region having the second conductivity type and disposed beneath the gate region and having a first portion disposed between the first and second column regions and having a second portion disposed between the third column and one of the first and second columns.

48. The integrated circuit of claim 47 wherein the device comprises a power MOS transistor.

49. The integrated circuit of claim 47 wherein the device comprises a power insulated-gate bipolar transistor.

50. A system, comprising:
a device, including
a gate region having first and second opposite sides;
first and second body regions having a first conductivity type and respectively disposed beneath the first and second sides of the gate region;
first and second source regions having a second conductivity type and respectively disposed in the first and second body regions;
first and second column regions having the first conductivity type, respectively disposed beneath one of the first and second body regions, and offset from one another; and
a first drain region having the second conductivity type and having a first portion disposed beneath the gate region having a second portion disposed directly beneath one of the first and second source regions, the second portion further disposed between the first and second column regions; and
a control circuit coupled to the device.

51. The system of claim 50 wherein the device and control circuit are disposed on a same integrated circuit die.

52. The system of claim 50 wherein the device and control circuit are disposed on respective integrated circuit dies.

53. The system of claim 50 wherein the device comprises a power transistor.

54. The system of claim 50 wherein the control circuit comprises a controller.

55. The system of claim 50 wherein the control circuit comprises a processor.

56. A vehicle, comprising:
a transistor, including
a gate region having first and second opposite sides;
first and second body regions having a first conductivity type and respectively disposed beneath the first and second sides of the gate region;
first and second source regions having a second conductivity type and respectively disposed in the first and second body regions;
first and second column regions having the first conductivity type, respectively disposed beneath one of the first and second body regions, and offset from one another; and
a first drain region having the second conductivity type and having a first portion disposed beneath the gate region having a second portion disposed directly beneath one of the first and second source regions, the second portion further disposed between the first and second column regions; and
a control circuit coupled to the transistor.

57. A method, comprising:
forming a drain region having a first conductivity;
forming, in the drain region, first and second column regions having a second conductivity type and offset from one another with respect to a first direction, and partially facing one another with respect to a second direction transversal to the first direction;

forming, over the first and second column regions, first and second body regions having the second conductivity type;

forming, in the first and second body regions, first and second source regions having the first conductivity type; and forming, over the first and second source regions, a gate region.

58. The method of claim 57 wherein forming the drain region and the first and second body regions comprises forming the drain region and the first and second body regions in an epitaxial layer.

59. The method of claim 57 wherein forming the drain region comprises forming the drain region over a substrate.

60. The method of claim 57 wherein forming the drain region comprises:

forming a first portion of the drain region in a substrate having the first conductivity type; and forming a second portion of the drain region over the first portion of the drain region.

61. The method of claim 57 wherein forming the first and second column regions comprises forming the first and second column regions overlapping one another.

62. The method of claim 57, further comprising forming, beneath the first and second column regions, first and second buried regions having the second conductivity type.

63. A device, comprising:

a gate region;

a first body region having a first conductivity type and disposed partially beneath the gate region;

a source region having a second conductivity type and respectively disposed in the body region;

first and second column regions having the first conductivity type, respectively disposed beneath the body region, and offset from one another; and a first drain region having the second conductivity type and having a first portion disposed beneath the gate region and having a second portion disposed directly beneath the source region, the second portion further disposed between the first and second column regions.

* * * * *